(12) United States Patent
Fukuda et al.

(10) Patent No.: US 7,087,455 B2
(45) Date of Patent: Aug. 8, 2006

(54) SEMICONDUCTOR DEVICE AND MANUFACTURING METHOD FOR THE SAME

(75) Inventors: Toshiyuki Fukuda, Nagaokakyou (JP); Hiroaki Fujimoto, Hirakata (JP); Mutsuo Tsuji, Izumiotsu (JP); Takashi Yui, Otsu (JP); Yoshiaki Takeoka, Kameoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 154 days.

(21) Appl. No.: 10/636,595

(22) Filed: Aug. 8, 2003

(65) Prior Publication Data

US 2004/0145040 A1 Jul. 29, 2004

(30) Foreign Application Priority Data

Jan. 29, 2003 (JP) ............................. 2003-020313

(51) Int. Cl.
*H01L 21/44* (2006.01)
(52) U.S. Cl. ..................................... 438/106
(58) Field of Classification Search ................. 438/106
See application file for complete search history.

(56) References Cited

U.S. PATENT DOCUMENTS

| 6,353,263 B1 | 3/2002 | Dotta et al. |
| 6,503,776 B1 * | 1/2003 | Pai et al. ................... 438/106 |

FOREIGN PATENT DOCUMENTS

| JO | 2000299431 | 10/2000 |
| JP | 98220 | 1/1997 |
| JP | 11204720 | 7/1999 |
| JP | 2002/368190 | 12/2002 |

OTHER PUBLICATIONS

Japanese Office Action dated Jan. 11, 2006 with English translation.

* cited by examiner

*Primary Examiner*—David S. Blum
(74) *Attorney, Agent, or Firm*—Stevens, Davis, Miller & Mosher, LLP

(57) ABSTRACT

A semiconductor device and a manufacturing method for the same are provided wherein the reliability of connections of fine metal wires connecting a second semiconductor chip to a wiring board can be improved in the case wherein the second semiconductor chip, which is located above the lower, first semiconductor chip, is significantly larger than the first semiconductor chip in a configuration wherein two semiconductor chips are stacked and mounted on a wiring board. In this semiconductor device the rear surface of the first semiconductor chip and the rear surface of the second semiconductor chip are adhered to each other by means of adhesive and the side of the adhesive is inclined from the edge portions of the first semiconductor chip toward the portions of the second semiconductor chip extending from the side of the first semiconductor chip. Therefore, it becomes possible to prevent the occurrence of microcracks in the second semiconductor chip and to prevent the occurrence of defective fine metal wire connections caused by the impact at the time of electrical connection of the second semiconductor chip to the wiring board.

6 Claims, 10 Drawing Sheets a - a'

SEMICONDUCTOR DEVICE AND MANUFACTURING METHOD FOR THE SAME

BACKGROUND OF THE INVENTION

1. Field of the Invention

The present invention relates to a semiconductor device molded in resin wherein a plurality of semiconductor chips and passive parts are mounted within one semiconductor device molded in resin and to a manufacturing method for the same. The present invention relates, in particular, to a semiconductor device molded in resin wherein two semiconductor chips are stacked and mounted on a wiring board and to a manufacturing method for the same.

2. Description of the Background Art

In recent years reduction in the weight and thickness of mobile apparatuses, as represented by notebook personal computers, cellular phones, and the like, has rapidly progressed. According to such a trend an increase in the density of electronic parts and an enhancement in performance are required for electronic parts mounted on the mother boards of the apparatuses, in particular, for semiconductor devices, which make up the core of the apparatuses. Conventionally an MCM (multichip module) wherein a plurality of semiconductor chips is mounted on a plane surface of an interposer (substrate having external terminals for direct mounting on a mother board), for example, is generally used (see Japanese unexamined patent publication H09 (1997)-8220 (FIG. 1)) in the case wherein a plurality of semiconductor chips is incorporated within one semiconductor device. Moreover, in order to further increase the configuration density within the semiconductor device, a method of stacking semiconductor chips, for example, has come into wide use (see Japanese unexamined patent publication H11 (1999)-204720 (FIGS. 1 and 3)). The size of a semiconductor chip mounted above the lower chip is, in general, smaller than the lower chip to make connection of fine metal wires easy in the case wherein a plurality of semiconductor chips is stacked in a conventional manner. In some cases, however, the dimensions of the upper semiconductor chip are greater than that of the lower chip in the configuration wherein the lower chip is, for example, directly bonded to a board and the upper semiconductor chip is mounted on the lower chip so that the electric circuit thereof faces upward (see Japanese unexamined patent publication 2000-299431 (FIG. 1) and Japanese unexamined patent publication 2001-320014 (FIG. 1)). These cases disclose a technique of supporting the upper chip with supports, or support members.

The upper semiconductor chip is larger than the lower semiconductor chip and the upper semiconductor chip is in a condition extending in an overhanging manner over the lower semiconductor chip, which is a flip chip, in a conventional semiconductor device molded in resin having a configuration wherein the lower semiconductor chip is directly flip chip bonded to a carrier board and the upper semiconductor chip is mounted on the lower chip with the electric circuit thereof facing upward. In this case microcracks may occur in the upper semiconductor chip or defective connections of fine metal wires may occur due to impact at the time of connection of fine metal wires to the upper semiconductor chip by means of an ultrasonic wave or thermocompression bonding method.

Here, a problem is described in reference to FIGS. 10A and 10B. FIG. 10A is a cross sectional view showing a conventional semiconductor device molded in resin and FIG. 10B shows an enlarged view of a portion of FIG. 10A. In addition, the enlarged view shows the phenomenon that is the problem. In a semiconductor device molded in resin having a configuration wherein first semiconductor chip 1, is directly flip chip bonded to a carrier board 20 and a second semiconductor chip 2 is mounted on first semiconductor chip 1 so that the electric circuit thereof faces upward, Au wires 7 are connected to electrode pads 4 of second semiconductor chip 2 using capillary 10, as shown in FIGS. 10A and 10B. At this time second semiconductor chip 2 bends symbol (11 indicates the amount of bending Δh) due to the impact from the load when ball bonding is carried out while ultrasonic waves and the load are being applied to an electrode pad 4 at a high temperature (from 150° C. to 250° C.) in the case wherein second semiconductor chip 2 is significantly larger than first semiconductor chip 1. Therefore, a microscopic crack 12 occurs in the case wherein an Au wire 7 cannot be stably bonded or in the case wherein the load is too great. Stud bumps are denoted by symbol 5, conductive paste is denoted by symbol 6, underfill resin is denoted by symbol 13 and adhesive is denoted by symbol 14 in FIGS. 10A and 10B.

SUMMARY OF THE INVENTION

A purpose of the present invention is to provide a semiconductor device and a manufacturing method for the same wherein the reliability of connections of fine metal wires connecting an upper semiconductor chip to a wiring board can be improved in the case wherein the upper semiconductor chip, which is located above a lower semiconductor chip, is significantly larger than the lower semiconductor chip in a configuration wherein the two semiconductor chips are stacked and mounted on a wiring board.

In order to achieve the above described purpose, a semiconductor device of the first invention is provided with: a wiring board having a first wiring electrode and a second wiring electrode; a first semiconductor chip having, on the top surface, an electrode connected to the first wiring electrode; and a second semiconductor chip, which is mounted on the first semiconductor chip, which is larger than the first semiconductor chip and which has, at least in the periphery of the top surface, an electrode electrically connected to the second wiring electrode by means of a fine metal wire, wherein the rear surface of the first semiconductor chip and the rear surface of the second semiconductor chip are adhered to each other by means of adhesive and the sides of the adhesive are inclined from the edge portions of the first semiconductor chip toward the portions of the second semiconductor chip extending from the sides of the first semiconductor chip.

According to this configuration the rear surface of the first semiconductor chip and the rear surface of the second semiconductor chip are adhered to each other by means of adhesive and the side of the adhesive is inclined from the edge portions of the first semiconductor chip toward the portions of the second semiconductor chip extending from the sides of the first semiconductor chip and, therefore, the size and form of the adhesive can be optimized. Therefore, it becomes possible to prevent the occurrence of microcracks in the second semiconductor chip and to prevent the occurrence of defective fine metal wire connections caused by the impact at the time of electrical connection of the second semiconductor chip to the wiring board. Thereby, a semiconductor device of a high reliability molded in resin wherein semiconductor chips are stacked can be provided.

A semiconductor device of the second invention is the semiconductor device of the first invention wherein the area of the cross section of the adhesive in a plane along the plane direction of the first semiconductor chip is no less than the area of the rear surface of the first semiconductor chip. According to this configuration the area of the cross section of the adhesive in a plane along the plane direction of the first semiconductor chip is no less than the area of the rear surface of the first semiconductor chip and, therefore, an adhesive having a size that is significantly greater than that of the first semiconductor chip and a sufficient thickness can be formed on the rear surface of the second semiconductor chip. Thereby, defective bonding caused by the impact to the fine metal wires and microcracks in the second semiconductor chip can be further prevented.

A semiconductor device of the third invention is the semiconductor device of the first invention wherein the surface of the side of the adhesive is in a concave, curved form. According to this configuration the surface of the side of the adhesive is in a concave, curved form and, therefore, a cross section of the adhesive perpendicular to the rear surface of the first semiconductor chip is in an inverted arched form, wherein sufficient stiffness for bearing mechanical stress is provided in the same manner as in a bridge pier so as to be able to bear the load from wire bonding.

A semiconductor device of the fourth invention is the semiconductor device of the first invention wherein the adhesive is formed over the entire region of the rear surface and over a portion of the sides of the first semiconductor chip. According to this configuration the adhesive is formed over the entire region of the rear surface and over a portion of the sides of the first semiconductor chip and, therefore, the application of a bending moment force with a starting point at the corner portion of the rear surface of the first semiconductor chip can be suppressed in the case wherein the load from wiring bonding is applied to the electrode of the second semiconductor chip.

A semiconductor device of the fifth invention is the semiconductor device of the first invention wherein an underfill resin is placed between the wiring board and the first semiconductor chip and wherein at least a portion of the side of the underfill resin is covered with an adhesive. According to this configuration an underfill resin is placed between the wiring board and the first semiconductor chip and at least a portion of the side of the underfill resin is covered with an adhesive and, therefore, the application of a bending moment force with a starting point at the corner portion of the rear surface of the first semiconductor chip can be further suppressed.

A semiconductor device of the sixth invention is the semiconductor device of the first invention wherein a passive part is electrically connected to the mounting surface of the first semiconductor chip on the wiring board, wherein the second semiconductor chip is larger than the region where the first semiconductor chip and the passive part are placed and wherein the rear surface of the second semiconductor chip and the rear surface of the passive part facing the rear surface of the second semiconductor chip are adhered to each other. According to this configuration a passive part is electrically connected to the mounting surface of the first semiconductor chip on the wiring board, wherein the second semiconductor chip is larger than the region where the first semiconductor chip and the passive part are placed and wherein the rear surface of the second semiconductor chip and the rear surface of the passive part facing the rear surface of the second semiconductor chip are adhered to each other and, therefore, the same working effects as of the first invention can be gained in a semiconductor device wherein a plurality of semiconductor chips and a passive part are mounted.

A semiconductor device of the seventh invention is the semiconductor device of the first invention wherein a passive part is electrically connected to the mounting surface of the first semiconductor chip on the wiring board, wherein the second semiconductor chip is larger than the region where the first semiconductor chip and the passive part are placed, wherein a spacer is adhered to the rear surface of the passive part so that the height of the spacer becomes approximately equal to the height of the rear surface of the first semiconductor chip and wherein the rear surface of the second semiconductor chip and the rear surface of the passive part facing the rear surface of the second semiconductor chip are adhered to each other in the condition wherein the spacer is intervened therebetween. According to this configuration a spacer is adhered to the rear surface of a passive part so that the height of the spacer becomes approximately equal to the height of the rear surface of the first semiconductor chip and, therefore, the second semiconductor chip is maintained in a stable condition even in the case wherein the height of the rear surface of the first semiconductor chip and the height of the rear surface of the passive part differ from each other and the load from wire bonding is applied to the electrode of the second semiconductor chip.

A manufacturing method for a semiconductor device of the eighth invention is provided with: the step of preparing a wiring board having a first wiring electrode and a second wiring electrode as well as a first semiconductor chip having an electrode on the top surface; the step of electrically connecting the first wiring electrode of the wiring board to the electrode of the first semiconductor chip via a bump; the step of preparing a second semiconductor chip that is larger than the first semiconductor chip and that has an electrode in at least the periphery of the top surface; the step of adhering the rear surface of the first semiconductor chip, which is the side opposite to the electrode, and the rear surface of the second semiconductor, which is the side opposite to the electrode, to each other by means of adhesive; and the step of connecting the electrode of the second semiconductor chip to the second wiring electrode of the wiring board by means of a fine metal wire, wherein the adhesive is formed so that the side of the adhesive is inclined from the end portions of the first semiconductor chip toward the portions of the second semiconductor chip extending from the sides of the first semiconductor chip at the time of the step of adhering the first semiconductor chip and the second semiconductor chip to each other.

According to this configuration the adhesive is formed to have an optimized size and form so that the side of the adhesive is inclined from the end portions of the first semiconductor chip toward the portions of the second semiconductor chip extending from the sides of the first semiconductor chip at the time of the step of adhering the first semiconductor chip and the second semiconductor chip to each other and, thereby, it becomes possible to prevent the occurrence of defective bonding caused by the impact to the fine metal wires for electrically connecting the second semiconductor chip to the wiring board and to prevent the occurrence of microcracks in the second semiconductor chip. Thereby, a manufacturing method for a semiconductor device of a high reliability molded in resin wherein semiconductor chips are stacked can be provided.

A manufacturing method for a semiconductor device of the ninth invention is the manufacturing method for a semiconductor device of the eighth invention wherein the fine metal wire is connected to the electrode of the second semiconductor chip after a molten ball is formed of the end of the fine metal wire on the second wiring electrode of the wiring board at the time of the step of connecting the second semiconductor chip to the wiring board by means of the fine metal wire. According to this configuration the fine metal wire is connected to the electrode of the second semiconductor chip after a molten ball is formed of the end of the fine metal wire on the second wiring electrode of the wiring board at the time of the step of connecting the second semiconductor chip to the wiring board by means of the fine metal wire and, therefore, it becomes possible limit the height above the second semiconductor chip of the fine metal wires to a low height.

A manufacturing method for a semiconductor device of the tenth invention is the manufacturing method for a semiconductor device of the eighth invention wherein the wiring board and a passive part are electrically connected to each other at the time of the step of electrically connecting the wiring board to the first semiconductor chip and wherein the rear surface of the second semiconductor chip and the rear surface of the passive part facing the rear surface of the second semiconductor chip are adhered to each other in the case wherein a spacer is intervened therebetween so that the height of the rear surface of the first semiconductor chip and the height of the spacer become approximately equal at the time of the step of adhering the first semiconductor chip to the second semiconductor chip.

According to this configuration the wiring board and a passive part are electrically connected to each other at the time of the step of electrically connecting the wiring board to the first semiconductor chip and, therefore, the same working effects as of the eighth invention can be gained in a semiconductor device wherein a plurality of semiconductor chips and a passive part are mounted. In addition, the rear surface of the second semiconductor chip and the rear surface of the passive part facing the rear surface of the second semiconductor chip are adhered to each other in the case wherein a spacer is intervened therebetween so that the height of the rear surface of the first semiconductor chip and the height of the spacer become approximately equal at the time of the step of adhering the first semiconductor chip to the second semiconductor chip and, therefore, the second semiconductor chip can be maintained in a stable condition at the time of connecting the second semiconductor chip to the wiring board by means of fine metal wires even in the case wherein the height of the rear surface of the first semiconductor chip and height of the rear surface of the passive part differ from each other.

A manufacturing method for a semiconductor device of the eleventh invention is the manufacturing method for a semiconductor device of the eighth invention wherein the wiring board and a passive part are electrically connected to each other and an underfill resin is placed between the wiring board and the first semiconductor chip at the time of the step of electrically connecting the wiring board to the first semiconductor chip and wherein the rear surface of the second semiconductor chip and the rear surface of the passive part facing the rear surface of the second semiconductor chip are adhered to each other in the case wherein a spacer is intervened therebetween so that the height of the rear surface of the first semiconductor chip and the height of the spacer become approximately equal and a material having a thixotropy greater than that of the underfill resin is used for the spacer at the time of the step of adhering the first semiconductor chip to the second semiconductor chip. It is necessary to fill in the underfill resin by injection into a narrow gap (from several μm to several tens of μm) between the first semiconductor chip and the wiring board and, therefore, a low thixotropy is required for the underfill resin while it is necessary for the spacer to be transformed in a plastic manner so that the surface of the spacer and the rear surface of the first semiconductor chip share approximately the same plane in the case wherein an arbitrary load is applied at the time when the second semiconductor chip is mounted and, therefore, it is important for the thixotropic ratio of the spacer to be greater than that of the underfill resin so that the spacer plays a most important role.

DETAILED DESCRIPTION OF THE PREFERRED EMBODIMENTS

Figure 1A:
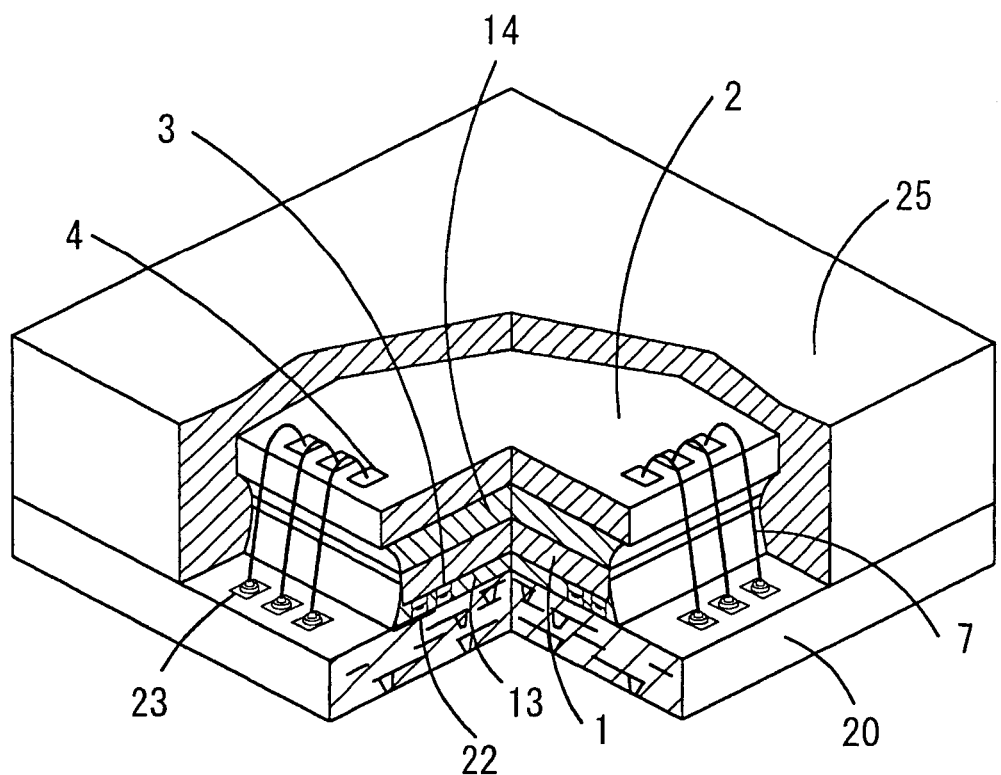
FIG. 1A is a perspective view showing semiconductor chips utilized in a semiconductor device molded in resin according to one embodiment of the present invention and FIG. 1B is a cross sectional view thereof.
Figure 1B:
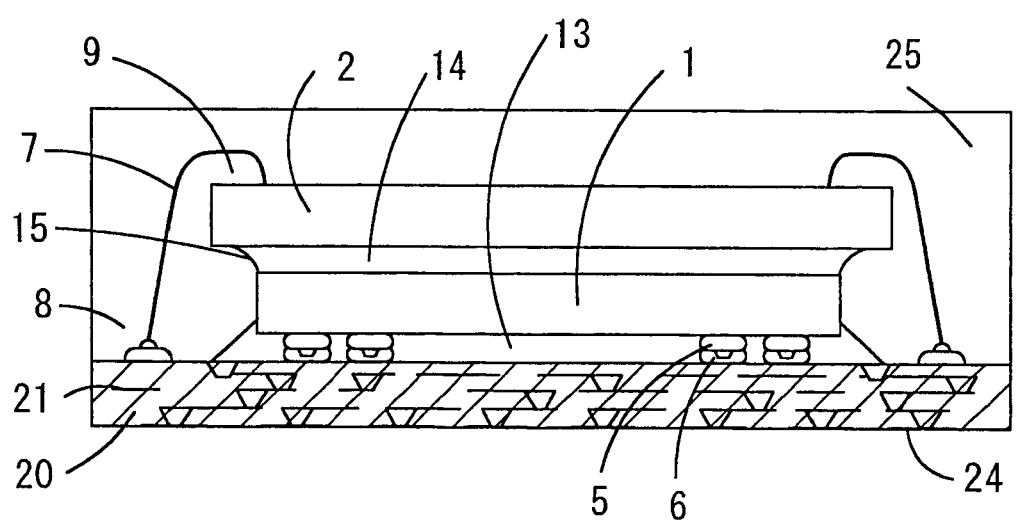

The embodiments of the present invention are described below with reference to FIGS. 1 to 7. FIG. 1A is a perspective view showing semiconductor chips utilized in a semiconductor device molded in resin according to one embodiment of the present invention and FIG. 1B is a cross sectional view thereof. Here, a partial cross section of the configuration of the semiconductor device is exposed in the perspective view for the purpose of ease of understanding.

The semiconductor device molded in resin shown in FIG. 1 is provided with:

a carrier board (wiring board) 20 having, on the top surface, a plurality of electrodes 22 and 23 as well as board wires 21 connected to electrodes 22 and 23 and having, on the rear surface, external terminals 24 electrically connected to electrodes 22, 23 and board wires 21;

a first semiconductor chip 1 having, on the top surface, electrode pads 3 connected to the plurality of electrodes (first wiring electrodes) 22 on the top surface of carrier board 20 via conductive paste 6 by means of Au bumps 5;

an underfill resin 13 that fills in the gap between first semiconductor chip 1 and carrier board 20 and that covers the peripheral edge portion of first semiconductor chip 1;

a second semiconductor chip 2, which is larger than first semiconductor chip 1, has electrode pads 4 in at least the periphery of the top surface and is connected to first semiconductor chip 1 back-to-back by means of an adhesive 14 having a thickness;

Au wires 7 for connecting electrode pads 4 of second semiconductor chip 2 to electrodes (second wiring electrodes) 23 of carrier board 20; and a mold resin 25 for covering and sealing first and second semiconductor chips 1 and 2 as well as Au wires 7. In addition, the side of adhesive 14 is inclined from the end portions of first semiconductor chip 1 toward the portions of second semiconductor chip 2 extending from the sides of the first semiconductor chip.

An alumina-based ceramic board, an aluminum nitride-based ceramic board, or the like, is used for carrier board 20. In addition, an insulating single layer, or multilayer, circuit board, or the like, made of an organic board, such as an epoxy board, may be used as another material. In addition, when a plurality of electrodes 22 on the top surface of carrier board 20 and electrode pads 3 on first semiconductor chip 1 are connected, conductive paste 6, such as Ag-Pd paste, is supplied to Au bumps 5 and first semiconductor chip 1, of which the top surface faces downward, is mounted onto carrier board 20 and conductive paste 6 is hardened. Thereby, the electrical and mechanical connections between carrier board 20 and first semiconductor chip 1 are secured. In addition, liquid molding resin is utilized as underfill resin 13 and, thereby, the gap between carrier substrate 20 and first semiconductor chip 1 is filled in and the peripheral end portions of first semiconductor chip 1 are covered. Adhesive 14, having a thickness, that connects first semiconductor chip 1 and second semiconductor chip 2 back-to-back may be adhesive layers applied to both surfaces of a tape material or may be an adhesive in a jelly form, such as a silicon-based adhesive. An important factor herein is that the thickness of the adhesive be arbitrarily set at a value between several tens of μm to several hundreds of μm and that the form of the cross section thereof be in a tapered form (oblique angle) or in an R surface form (concave, curved surface) and it is important for the adhesive to have an area that is significantly larger than that of first semiconductor chip 1.

Figure 2A:
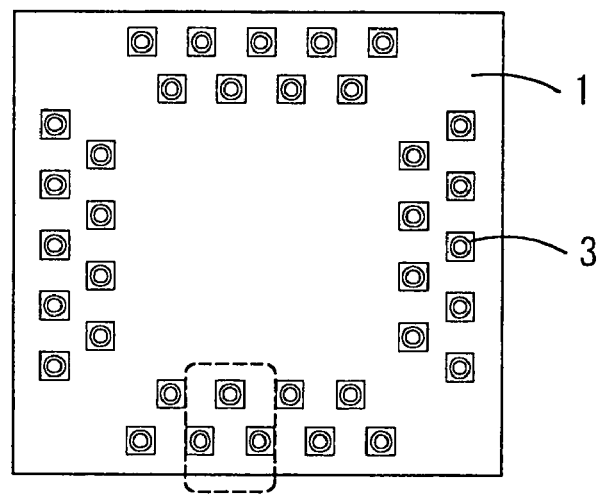
FIG. 2A is a plan view showing a first semiconductor chip utilized in a semiconductor device molded in resin according to one embodiment of the present invention.
Figure 2B:
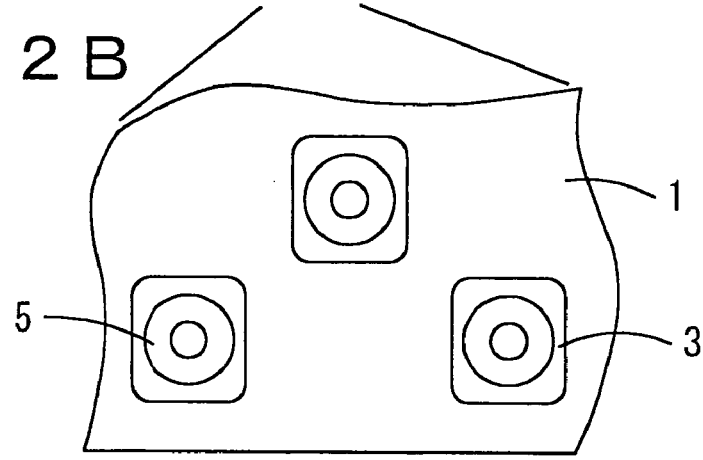
FIG. 2B is an enlarged view of a main portion of the first semiconductor chip and FIG. 2C is a view for describing the formation of an electrode pad.
Figure 2C:
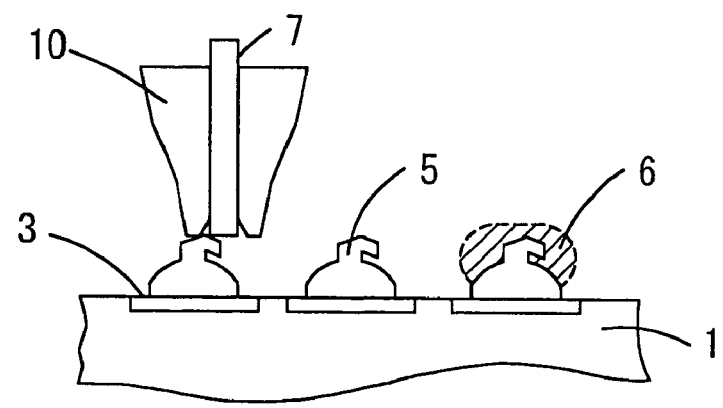

FIG. 2A is a plan view showing a first semiconductor chip utilized in a semiconductor device molded in resin according to one embodiment of the present invention, FIG. 2B is an enlarged view of a main portion of the first semiconductor chip and FIG. 2C is a view for describing the formation of an electrode pad.

The wire width according to the wiring rule for integrated circuits in semiconductor chips is, at present, progressing from 0.18 μm to 0.13 μm and, furthermore, to 0.10 μm in order to scale down the microscopic process. The pitch of the electrode pads for connection to the outside has been reduced in correspondence with the above and the pitch for the alignment of the electrode pads has been scaled down to 100 μm and to 80 μm in order to prevent increase in the area of the semiconductor chip. An electrode pad pitch of 60 μm, or less, however, provides a distance between adjacent electrode pads that is too narrow for a probe inspection or for the step of flip chip connection after the application of conductive paste to Au bumps and, therefore, a method is used wherein electrode pads 3 are arranged in a zigzag manner, as shown in FIGS. 2A and 2B. On the other hand, a POE (pad on element) wherein an electrode pad is formed on a circuit element or on a wire of an internal circuit is also generally used in order to prevent increase in the area of a semiconductor integrated circuit.

An Au bump 5 (also referred to as a stud bump, which is a bump in a two-stage protruding form) is formed on an electrode pad 3 of first semiconductor chip 1 using a wire bonding method (ball bonding method) as shown in FIG. 2C. According to this method a ball formed at the end of an Au wire is thermally compressed to an electrode pad 3 having a surface of Al, and thereby, the lower stage of the two-stage protrusion is formed and, furthermore, an Au wire loop is formed by shifting capillary 10 so that the upper stage of the two-stage protrusion is formed. The heights of the two-stage protrusions are not uniform and the tops thereof lack flatness in the above described condition and, therefore, leveling is carried out in order to make the heights of the two-stage protrusions uniform by compression and in order to make the tops thereof flat. This bump formation method is referred to as stud bump formation. Next, conductive paste 6 containing Ag—Pd as conductive material is applied to a rotating disk so as to gain an appropriate thickness using a doctor blade method. At this time conductive paste 6 is supplied to Au bumps 5 according to a method wherein first semiconductor chip 1, on which Au bumps 5 are provided, is pulled up after being pressed against conductive paste 6, which is a so-called transfer method. Conductive paste 6 made of epoxy resin, which is a binder, and of Ag—Pd coprecipitating powder, which is a conductive filler, for example, is used while taking the reliability and the thermal stress of conductive paste 6 into consideration.

Figure 3:
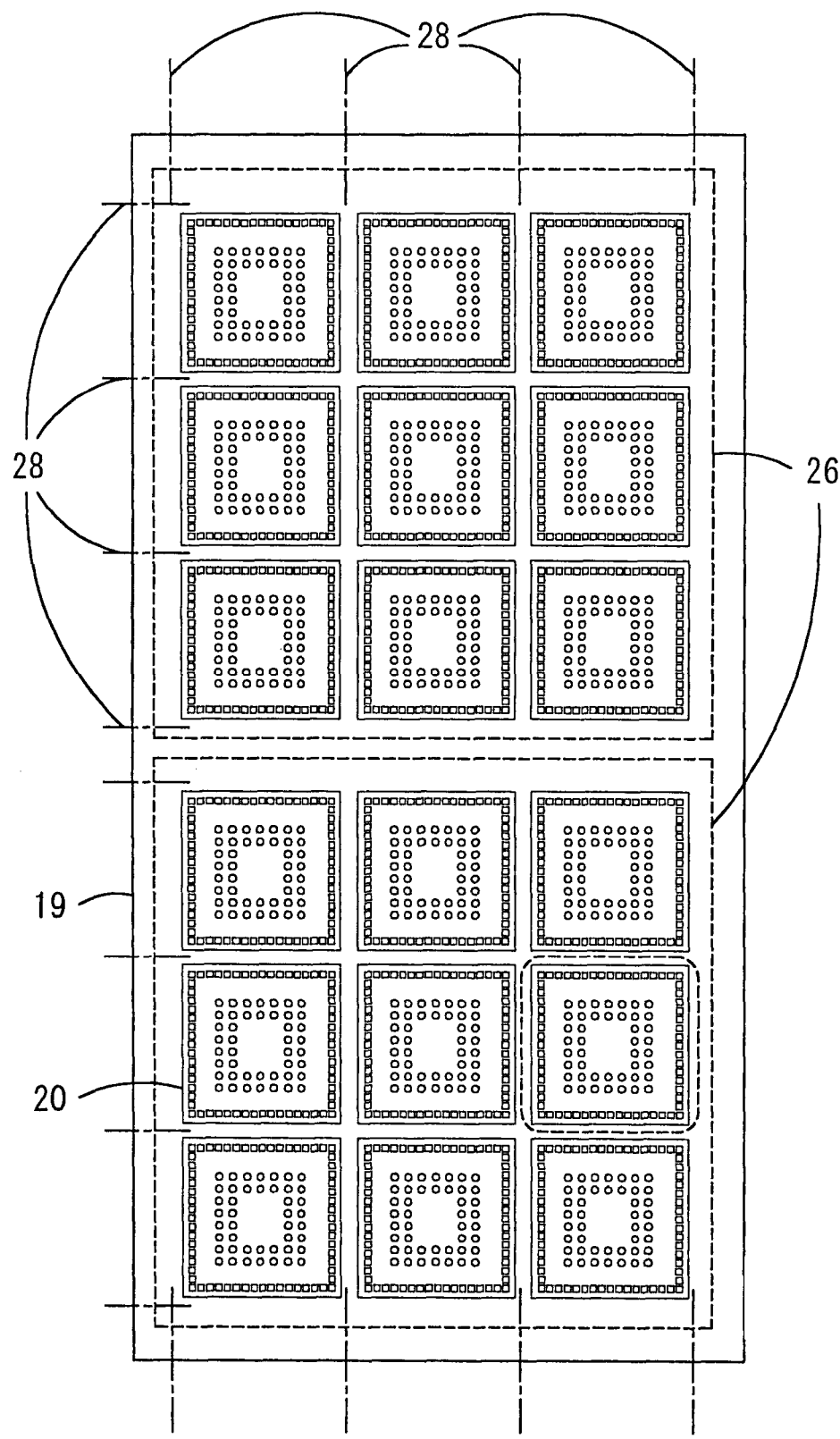
FIG. 3 is a plan view showing a sheet board utilized in a semiconductor device molded in resin according to one embodiment of the present invention.
Figure 4A:
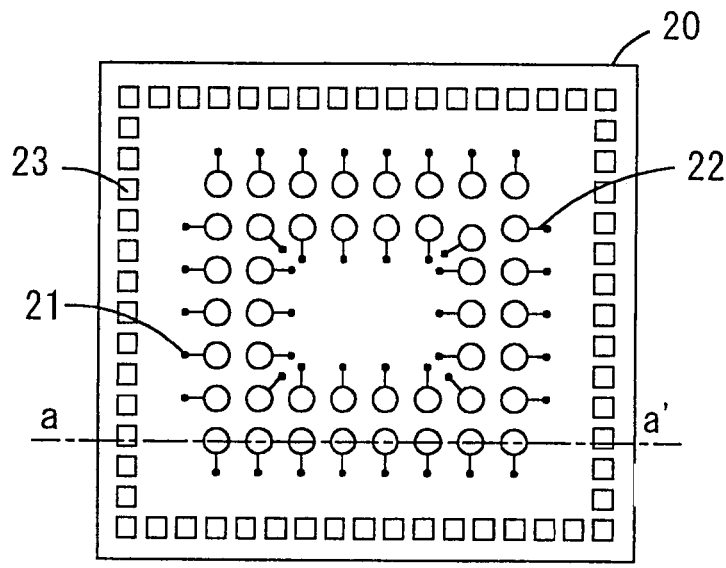
FIG. 4A is a plan view of the surface of the carrier board on which semiconductor elements are mounted in FIG. 3.
Figure 4B:
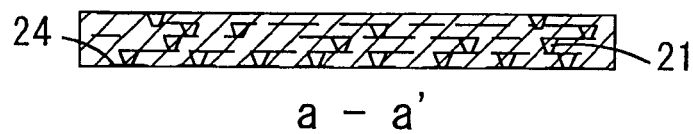
FIG. 4B is a cross sectional view along line a–a' and FIG. 4C is a plan view of the external terminal side of the carrier board.
Figure 4C:
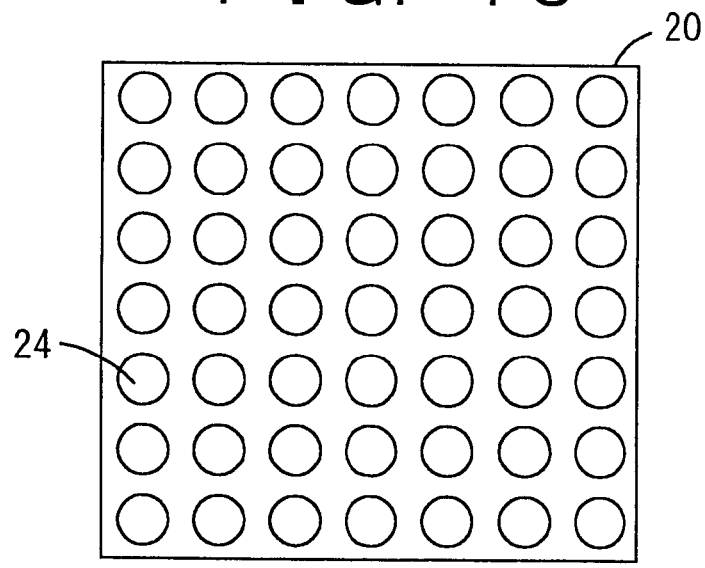

FIG. 3 is a plan view showing a sheet board utilized in a semiconductor device molded in resin according to one embodiment of the present invention, FIG. 4A is a plan view of the surface of the carrier board on which semiconductor elements are mounted in FIG. 3, FIG. 4B is a cross sectional view along line a–a' and FIG. 4C is a plan view of the external terminal side of the carrier board.

As shown in FIGS. 3 and 4, carrier board 20 is placed on a plurality of sheet boards 19. Electrodes 22 and 23 electrically connected to first and second semiconductor chips are provided on the side of carrier board 20 that is connected to the semiconductor chips. In addition, external terminals 24 are arranged in a grid form on the opposite side. An alumina-based ceramic board, an aluminum nitride-based, or the like, is used for carrier board 20 and the board is formed of a plurality, from four to eight, of layers corresponding to the wire density. The wires 21 in the respective layers are made of tungsten and the vias connecting the respective layers are made of molybdenum, which is electrically condition. In addition, tungsten wires having a thickness of from 10 μm to 30 μm are plated by means of non-electrode plating with Ni having a thickness of several μms and, in addition, they are plated with an Au layer having a thickness of from approximately 0.1 μm to 0.8 μm in order to form electrodes 22 and 23, which are electrically connected to the first and second semiconductor chips, and terminals 24 on the surface of the ceramic board. The thickness of the board is from 0.40 mm to 0.60 mm. Broken lines surrounding carrier boards 20, arranged on sheet boards 19, indicate molding lines 26 of resin molds integrally sealing a plurality of carrier boards 20. One-dotted chained lines between carrier boards 20 indicate the dividing lines 28 between products for division into individual semiconductor devices molded in resin.

Next, a manufacturing method for a semiconductor device is described. FIGS. 5A to 5D and FIGS. 6A and 6B are cross sectional views showing a semiconductor device molded in resin during a manufacturing process according to one embodiment of the present invention.

Figure 5A:
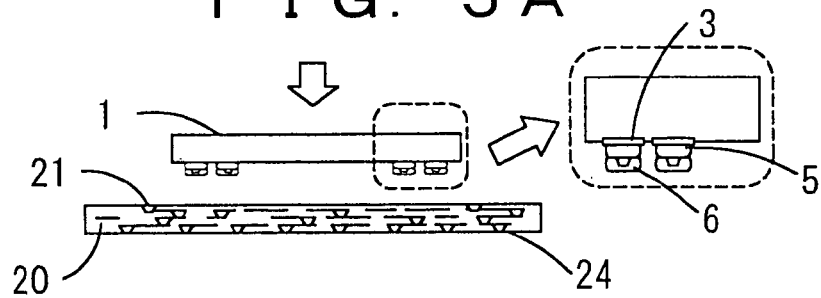
FIGS. 5A to 5D are cross sectional views showing a semiconductor device molded in resin during manufacturing steps according to one embodiment of the present invention.

FIG. 5A shows the step of connecting first semiconductor chip 1, which is a flip chip, to carrier board 20. According to a flip chip system wherein the top surface of first semiconductor chip 1 is made to face downward for mounting, Au bumps 5 on first semiconductor chip 1, to which conductive paste 6 is supplied, and electrodes 22 on carrier board 20, on the bottom surface of which external terminals 24 are formed at constant intervals in a grid form, are positioned with a high precision so as to be connected to each other and, after that, thermosetting is carried out at a constant temperature. This connection method is referred to as the SBB (stud bump bonding) method. Here, the formation of Au bumps 5 and conductive paste 6 are described in detail above in reference to FIG. 2 and a description thereof is omitted here.

Figure 5B:

Next, FIG. 5B shows the step of sealing the gap beneath first semiconductor chip 1, which has been connected as a flip chip, with underfill resin 13. This is the step wherein molding with resin is carried out by injecting underfill resin 13, which is a liquid epoxy resin that is a thermosetting resin, into the gap created between first semiconductor chip 1 and carrier board 20 as well as into the peripheral portion around first semiconductor chip 1 by means of nozzle 29 and of hardening the resin. The purpose of this step is to protect the integrated circuit on the top surface of first semiconductor chip 1 as well as Au bumps 5 and conductive paste 6 over electrode pads 3.

Figure 5C:
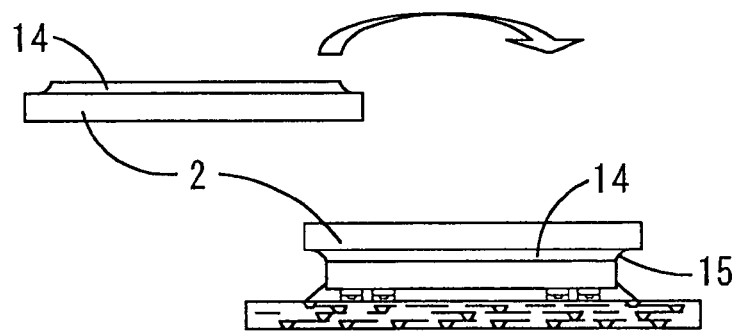

Next, FIG. 5C shows the step of adhering the rear surface of first semiconductor chip 1 to the rear surface of second semiconductor chip 2 back-to-back. Adhesive 14 having a size that is significantly larger than first semiconductor chip 1 and having a thickness is temporarily adhered to the rear surface of second semiconductor chip 2. Adhesive 14 may be formed of adhesive layers that have been applied to both sides of a tape material in advance or may be an adhesive in a jelly form, such as a silicon-based adhesive. An important factor herein is that the thickness of adhesive 14 be arbitrarily set at a value between several tens of μm to several hundreds of μm and that the form of the cross section of the side of adhesive 14 be in a tapered form (oblique angle) or in an R surface form (curved surface). Adhesive 14, having a size greater than that of first semiconductor chip 1, is prepared and is attached to the rear surface of second semiconductor chip 2 by means of a tool. At this time a tape having excellent releasability may be attached to the tool in order to prevent adhesive 14 from becoming stuck to the tool.

Though not shown, a concrete adhesive method is described wherein a dicing sheet is attached to the top surface of second semiconductor chips 2, which are still in a wafer, and dicing is carried out from the rear surface of second semiconductor chips 2. After that, second semiconductor chips 2 that are good products are selected according to the above conditions and, then, adhesive 14 is attached to the rear surfaces of these chips. Next, these chips are adhered and fixed to the rear surfaces of first semiconductor chips 1 via the dicing sheet.

Figure 5D:
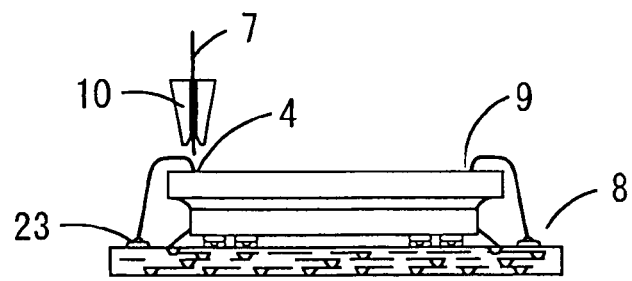

Next, FIG. 5D shows the step of electrically connecting second semiconductor chip 2 to carrier board 20 by means of Au wires 7. An ultrasonic wave and thermal compression method is used as a method for electrically connecting second semiconductor chip 2 to carrier board 20 by means of Au wires 7. The end of Au wire 7 is made molten by means of a spark and is formed into a ball under the condition wherein Au wire 7 has been threaded through capillary 10. Ultrasonic wave compression is carried out on the formed ball that is pressed to electrode 23 using capillary 10 so as to form a 1st side (ball side) 8. At this time carrier board 20 including second semiconductor chip 2 is heated to from 150° C. to 250° C. Next, loop control is carried out on Au wire 7 by means of capillary 10 and the wire is connected to electrode pad 4 on second semiconductor chip 2 so as to form a 2nd side (crescent side) 9.

According to the embodiment of the present invention a so-called reverse wire bonding method is used wherein the order of formation of the 1st side and 2nd side, which is the order of connection of the wires, is opposite to that of the generally and widely used wire bonding method. The merit of this method is that it is possible to limit the height above the second semiconductor chip 2 of Au wires 7 to a low height. Though not shown, there is a method for connecting the 2nd side of Au wire 7 to an Au bump by forming the Au bump on an electrode pad 4 in advance. A method wherein the step of covering the surface of electrode pads with Al, for example, is omitted so that Cu in the lower layer is exposed and Au bumps are formed directly on Cu and, then, the 2nd side of Au wire 7 is connected to an Au bump is cost effective. Here, Au wire 7 is made of gold (Au) with a purity of 99.99%, or higher, and has a diameter ranging from 15 μm to 30 μm while electrode pads have a surface of Al.

Figure 6A:
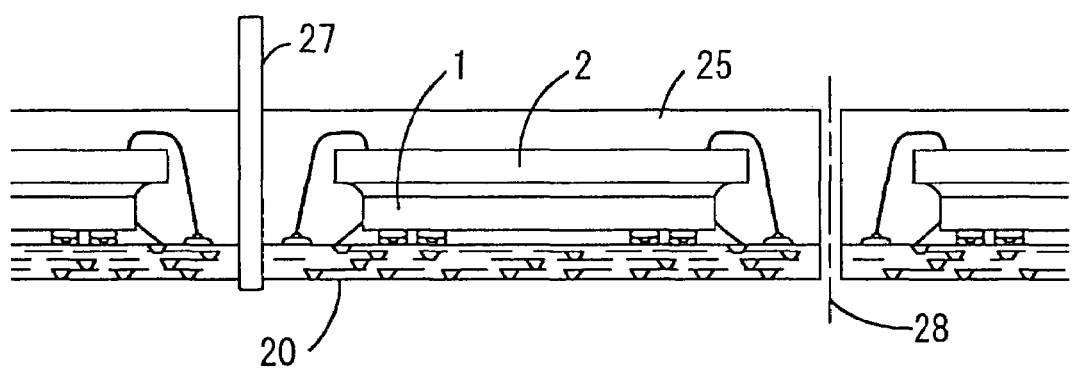
FIGS. 6A and 6B are cross sectional views during the steps following the steps of FIGS. 5A to 5D.

FIG. 6A shows a cross sectional view of a semiconductor device molded in resin. A semiconductor device, which is a semi-finished product, that has been completed through the steps up to and including the steps in FIG. 5D is placed in a resin molding die set (not shown) and is sandwiched therebetween. A thermosetting epoxy resin is heated to a temperature of from 150° C. to 200° C. so as to be liquefied and a portion of the product covering the outside of a semiconductor device is formed as a resin mold. After that the resin is hardened within the molding die set for a period of time of hardening of several tens of seconds and the product is removed from the die set. The molding resin side of a semiconductor device is fixed to an adhesive tape or is fixed by means of vacuum suction, for example, and the mold is divided into individual products along dividing lines 28 between products using a dicer with a blade or a laser as a cutting means for product division.

Figure 6B:
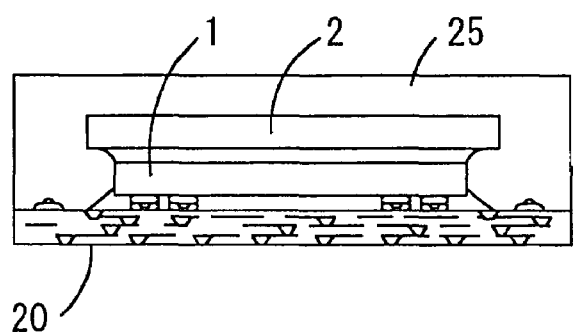

FIG. 6B shows a cross sectional view of a finished semiconductor device molded in resin.

Figure 7:
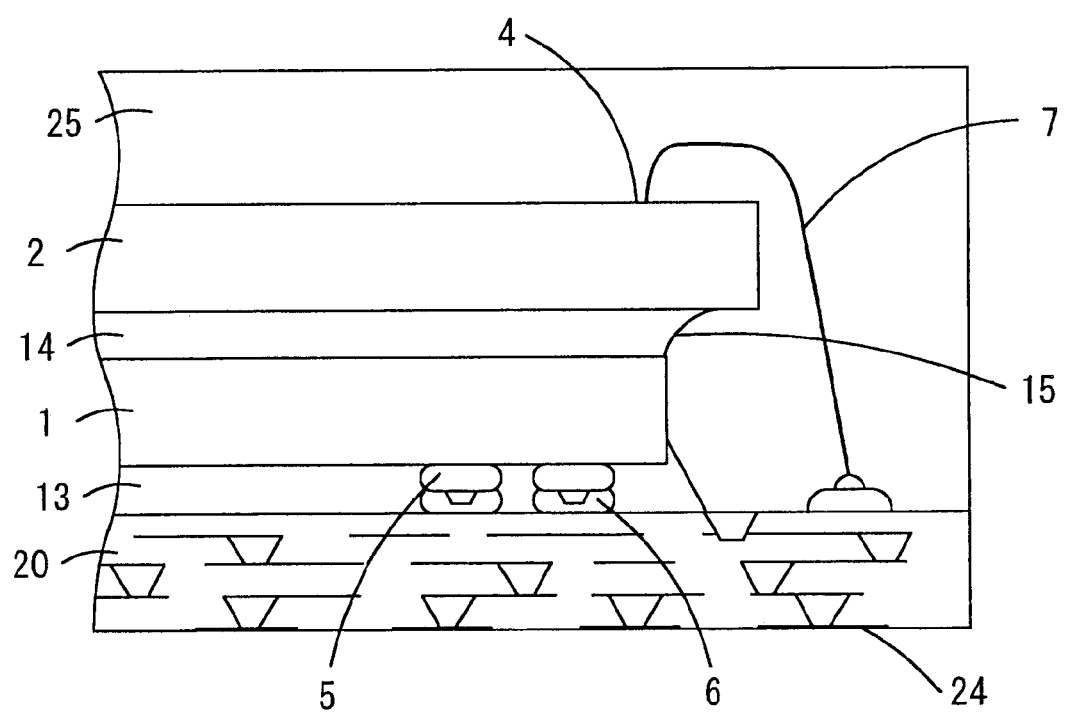
FIG. 7 is a cross sectional view showing the form of an adhesive according to one embodiment of the present invention.

FIG. 7 is an illustration for describing in detail the cross sectional form of FIG. 1. In cross sectional form 15 of the edge portion of adhesive 14, located between second semiconductor chip 2 and first semiconductor chip 1, the point of contact with second semiconductor chip 2 is located outside the point of contact with first semiconductor chip 1, as shown in FIG. 7. One method for implementing this shape is described above in reference to FIG. 5C. That is to say, at the time of the process of adhering first semiconductor chip 1 and second semiconductor chip 2 to each other, adhesive 14 is formed so that the side thereof is inclined from the edge portions of first semiconductor chip 1 toward the portions of second semiconductor chip 2, extending from the sides of first semiconductor chip 1. This form has a configuration in an inverted arch form, such as in a bridge pier, so as to be able to bear the load from wire bonding.

Figure 8A:
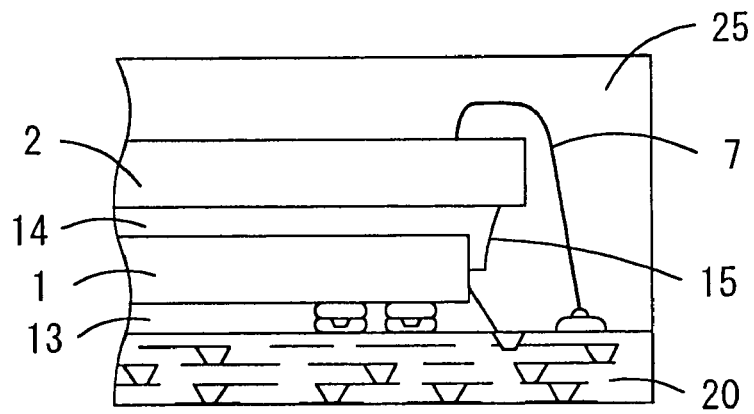
FIGS. 8A to 8C are cross sectional views of a semiconductor device molded in resin according to another embodiment of the present invention.
Figure 8B:
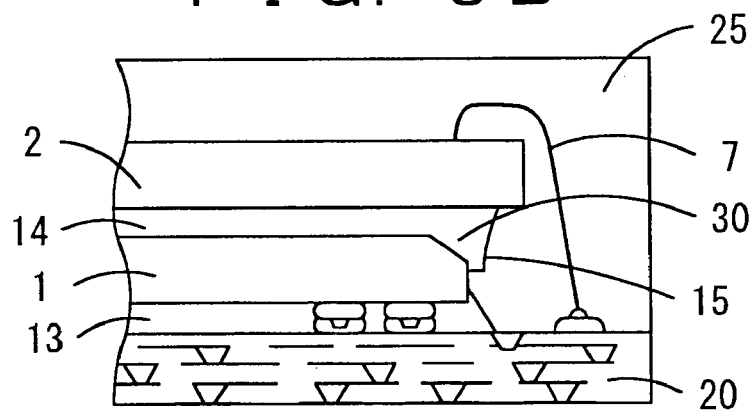
Figure 8C:
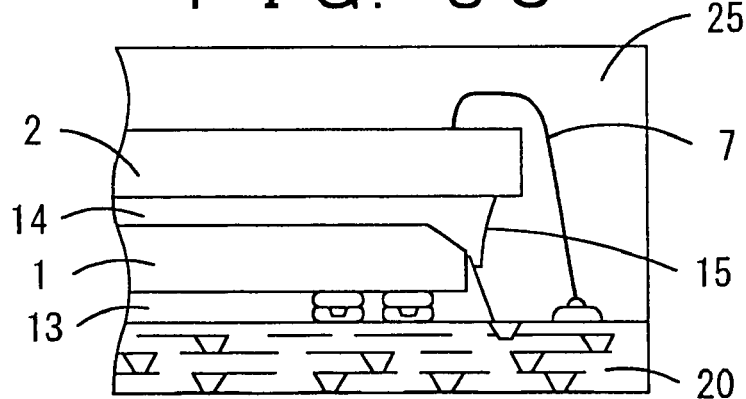

FIGS. 8A to 8C are cross sectional views of a semiconductor device molded in resin according to another embodiment of the present invention.

FIG. 8A shows the form of adhesive 14, of which the end portion partially covers the side of first semiconductor chip 1. This is in order to gain the same effects as described in reference to FIG. 7 and, in addition, in order to suppress the application of a bending moment force with a starting point at the corner portion of the rear surface of first semiconductor chip 1 in the case wherein the load from wiring bonding is applied to electrode pad 4 of second semiconductor chip 2.

FIG. 8B shows a structure wherein the corner portions of the rear surface of first semiconductor chip 1 are rounded in order to further suppress the application of a bending moment force to second semiconductor chip 2 with a starting point at the corner portion of the rear surface of first semiconductor chip 1 and, in addition, the same effects as in FIGS. 7 and 8A are gained.

FIG. 8C shows a structure wherein the edge portion of adhesive 14 covers the side of first semiconductor chip 1 and makes contact with underfill resin 13 that exists on the side of first semiconductor chip 1. Furthermore, the corner portions of the rear surface of first semiconductor chip 1 are rounded so as to form rounded portions 30 and the application of a bending moment force to second semiconductor chip 2 with a starting point at the corner portion of the rear surface of first semiconductor chip 1 can be prevented.

Figure 9A:
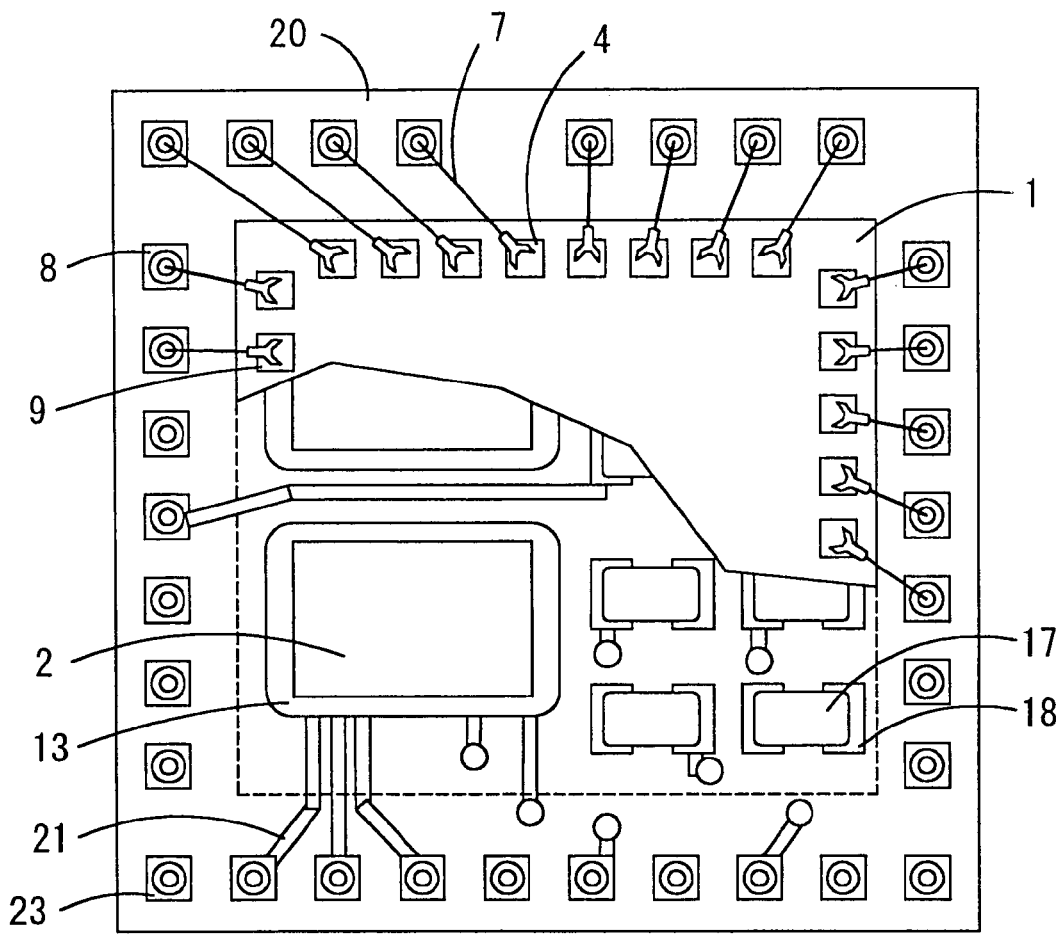
FIG. 9A is a partially penetrative plan view of a semiconductor device molded in resin according to still another embodiment of the present invention and FIG. 9B is a cross sectional view thereof.
Figure 9B:
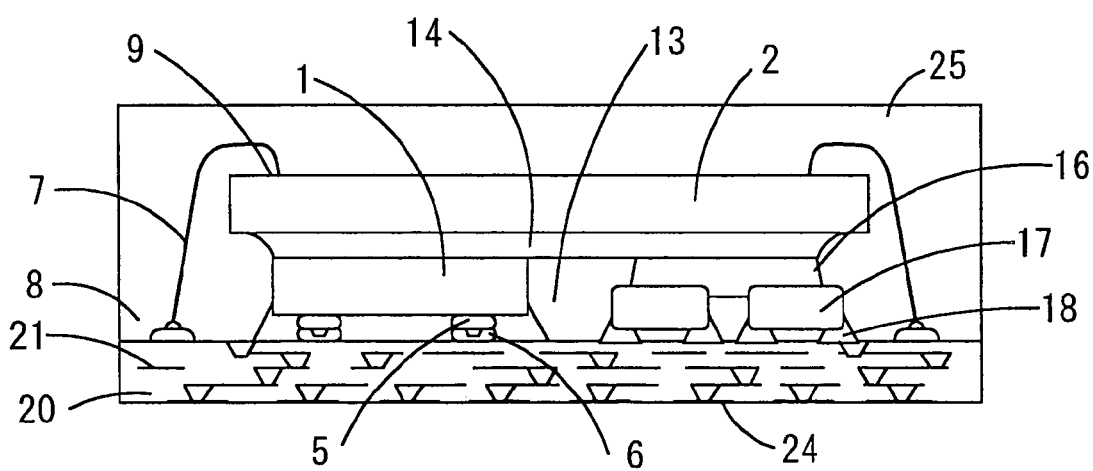
Figure 10A:
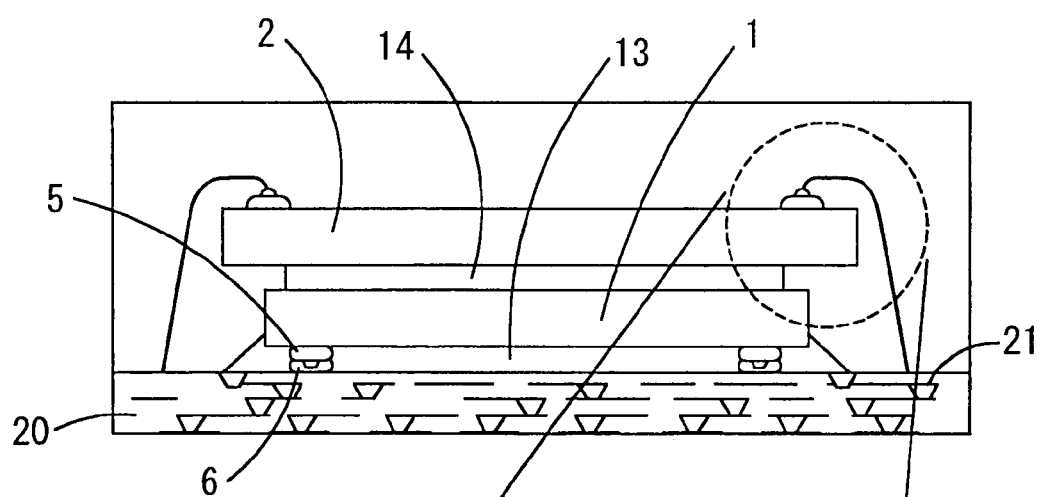
FIG. 10A is a cross sectional view showing a semiconductor device molded in resin according to a prior art and FIG. 10B is an enlarged view showing a portion thereof.
Figure 10B:
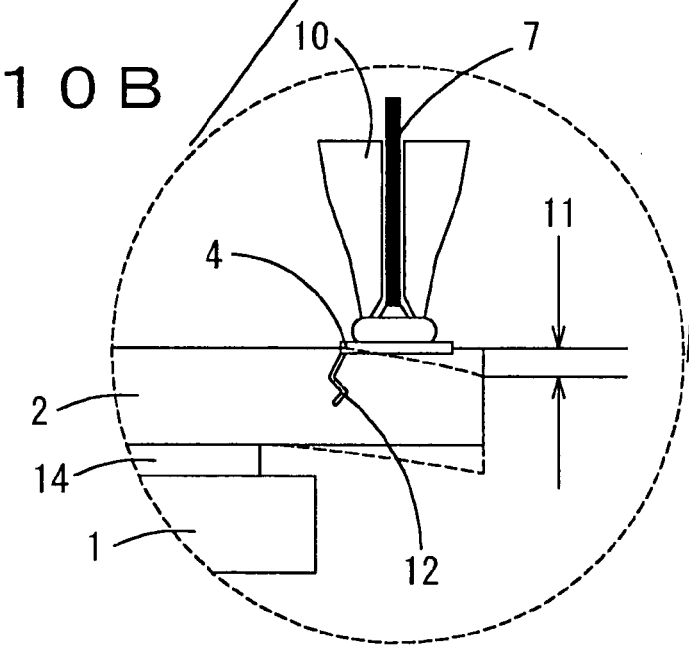

FIG. 9A is a partially penetrative plan view of a semiconductor device molded in resin according to still another embodiment of the present invention and FIG. 9B is a cross sectional view thereof.

As shown in FIGS. 9A and 9B, passive parts 17 are electrically connected to the mounting surface of first semiconductor chip 1 on carrier board 20 and second semiconductor chip 2 is larger than the region wherein first semiconductor chip 1 and passive parts 17 are arranged so that the rear surface of second semiconductor chip 2 and the rear surfaces of passive parts 17 facing the rear surface of second semiconductor chip 2 are adhered to each other. In addition, a spacer 16 is adhered to the rear surfaces of passive parts 17 so that the height of the spacer becomes approximately the same as the height of the rear surface of first semiconductor chip 1. Passive parts 17 are soldered to electrodes on carrier board 20.

The manufacturing process for this semiconductor device is the same as that shown in FIGS. 5A to 5D and FIGS. 6A and 6B except wherein passive parts 17 are electrically connected to carrier board 20 in the step (FIG. 5A) of electrically connecting first semiconductor chip 1 to carrier board 20. The step (FIG. 5C) of adhering first semiconductor chip 1 and second semiconductor chip 2 to each other is carried out under the condition wherein spacer 16 is intervened between the rear surface of second semiconductor chip 2 and the rear surfaces of passive parts 17 facing the rear surface of second semiconductor chip 2 after the provision of underfill resin 13 between carrier board 20 and first semiconductor chip 1, wherein the height of spacer 16 is approximately the same as that of the rear surface of first semiconductor chip 1. A material having a thixotropy greater than that of said underfill resin 13 is used for spacer 16.

What is claimed is:

1. A semiconductor device comprising:
   a wiring board having a first wiring electrode and a second wiring electrode;
   a first semiconductor chip having, on the top surface, an electrode connected to said first wiring electrode; and
   a second semiconductor chip, which is mounted on said first semiconductor chip, which is larger than the first semiconductor chip and which has, at least in the periphery of the top surface, an electrode electrically connected to said second wiring electrode by means of a fine metal wire, wherein:
   the rear surface of said first semiconductor chip and the rear surface of said second semiconductor chip are adhered to each other by means of adhesive and the sides of said adhesive are inclined from the edge portions of said first semiconductor chip toward the portions of said second semiconductor chip extending from the sides of the first semiconductor chip,
   a passive part is electrically connected to the same mounting surface on the wiring board that is connected to the first semiconductor chip,
   the second semiconductor chin is larger than the region where the first semiconductor chip and said passive cart are placed, and
   the rear surface of said second semiconductor chip and the rear surface of said passive cart facing the rear surface of said second semiconductor chip are adhered to each other.

2. The semiconductor device according to claim 1, wherein the area of the cross section of the adhesive in a plane along the plane direction of the first semiconductor chip is no less than the area of the rear surface of said first semiconductor chip.

3. The semiconductor device according to claim 1, wherein the surface of the side of the adhesive is in a concave, curved form.

4. The semiconductor device according to claim 1, wherein the adhesive is formed over the entire region of the rear surface and over a portion of the sides of the first semiconductor chip.

5. The semiconductor device according to claim 1, wherein an underfill resin is placed between the wiring board and the first semiconductor chip and wherein at least a portion of the side of said underfill resin is covered with an adhesive.

6. The semiconductor device according to claim 1, wherein a spacer is adhered to the rear surface of said passive part so that the height of the spacer becomes approximately equal to the height of the rear surface of the first semiconductor chip and the rear surface of said second semiconductor chip and the rear surface of said passive part facing the rear surface of said second semiconductor chip are adhered to each other via the intervening spacer.

* * * * *